US012402286B2

United States Patent
Kwon et al.

(10) Patent No.: US 12,402,286 B2
(45) Date of Patent: Aug. 26, 2025

(54) DOUBLE-SIDED COOLING APPARATUS FOR POWER MODULE

(71) Applicants: Hyundai Motor Company, Seoul (KR); Kia Corporation, Seoul (KR)

(72) Inventors: Se Heun Kwon, Whasung-Si (KR); Hyong Joon Park, Whasung-Si (KR); Sang Hun Lee, Whasung-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 130 days.

(21) Appl. No.: 17/946,962

(22) Filed: Sep. 16, 2022

(65) Prior Publication Data

US 2023/0189487 A1 Jun. 15, 2023

(30) Foreign Application Priority Data

Dec. 15, 2021 (KR) .......................... 10-2021-0179797

(51) Int. Cl.
*H05K 7/20* (2006.01)
*H01L 23/473* (2006.01)

(52) U.S. Cl.
CPC ....... *H05K 7/20927* (2013.01); *H01L 23/473* (2013.01); *H01L 23/4735* (2013.01); *H05K 7/20254* (2013.01); *H05K 7/20272* (2013.01)

(58) Field of Classification Search
CPC ........... H05K 7/20927; H05K 7/20272; H05K 7/20254; H01L 2023/4037; H01L 23/473
See application file for complete search history.

(56) References Cited

U.S. PATENT DOCUMENTS

| | | | |
|---|---|---|---|
| 9,445,526 B2 * | 9/2016 | Zhou | H01L 23/4735 |
| 9,980,415 B2 * | 5/2018 | Zhou | H05K 7/20927 |
| 10,096,537 B1 | 10/2018 | Chen et al. | |
| 10,575,447 B2 * | 2/2020 | Song | H05K 7/20254 |

(Continued)

FOREIGN PATENT DOCUMENTS

| | | | | |
|---|---|---|---|---|
| CN | 113518542 A | * | 10/2021 | ........... H01L 23/473 |
| JP | 2006-060114 | | 3/2006 | |

(Continued)

OTHER PUBLICATIONS

JP-2011198822—A Translation (2011) (Year: 2011).*
Espacenet English translation of JP2011198822A (Year: 2011).*

*Primary Examiner* — Robert J Hoffberg
(74) *Attorney, Agent, or Firm* — MORGAN, LEWIS & BOCKIUS LLP

(57) ABSTRACT

A double-sided cooling apparatus for a power module, includes a first cooling module contacting with a first side of the power module to which a switching device is mounted, and allowing cooling fluid to flow therein; and a second cooling module contacting with a second side of the power module provided opposite to the first side, and including a tube allowing the cooling fluid to flow in the tube, wherein the first cooling module includes a manifold cover including a plurality of cooling channels formed by a plurality of guide walls extending in a first direction, and a fin plate including a plurality of fins extending in a second direction intersecting the first direction, and the cooling channel includes a blocker so that the cooling fluid in the first cooling module flows in a mixed form of lateral flow and vertical flow of the cooling fluid.

15 Claims, 7 Drawing Sheets

(56) References Cited

U.S. PATENT DOCUMENTS

| | | | |
|---|---|---|---|
| 10,582,649 B2* | 3/2020 | Jo | H05K 7/20927 |
| 10,729,041 B2* | 7/2020 | Jeong | F25B 31/008 |
| 11,015,872 B2* | 5/2021 | Aston | H05K 7/20254 |
| 11,032,940 B2* | 6/2021 | Matsumura | H05K 7/20772 |
| 11,149,937 B2* | 10/2021 | Zhou | F28F 3/048 |
| 11,357,139 B2* | 6/2022 | Lee | H01L 23/44 |
| 11,439,040 B2* | 9/2022 | Jo | H05K 7/20 |
| 11,665,868 B2* | 5/2023 | Jeong | F28F 1/24 |
| | | | 165/80.4 |
| 11,849,569 B2* | 12/2023 | Zhou | H05K 7/20254 |
| 11,885,579 B2* | 1/2024 | Aston | H01L 23/473 |
| 12,017,500 B2* | 6/2024 | Kim | H05K 7/20927 |
| 12,033,918 B2* | 7/2024 | Kang | H01L 23/3672 |
| 2014/0185243 A1 | 7/2014 | Joo et al. | |
| 2015/0040583 A1* | 2/2015 | Kwak | H05K 7/20936 |
| | | | 62/3.2 |
| 2016/0126160 A1* | 5/2016 | Jeong | H01L 23/473 |
| | | | 29/890.035 |
| 2017/0055378 A1 | 2/2017 | Zhou et al. | |
| 2017/0094836 A1* | 3/2017 | Lo | H05K 7/20927 |
| 2017/0336152 A1* | 11/2017 | Jeong | F28F 1/02 |
| 2018/0077818 A1* | 3/2018 | Harkins | H05K 7/209 |
| 2020/0344920 A1* | 10/2020 | Lee | H05K 7/20927 |
| 2021/0239310 A1* | 8/2021 | Zhou | H01L 23/467 |
| 2021/0329815 A1* | 10/2021 | Kim | H05K 7/20936 |
| 2021/0337703 A1* | 10/2021 | Lee | H01L 23/473 |
| 2022/0097477 A1* | 3/2022 | Kim | H05K 7/20927 |
| 2023/0200008 A1* | 6/2023 | Lee | H05K 7/20927 |
| | | | 361/699 |
| 2023/0371200 A1* | 11/2023 | Lee | H01L 23/473 |
| 2023/0397384 A1* | 12/2023 | Park | H01L 23/4334 |
| 2023/0413478 A1* | 12/2023 | Kwon | H05K 7/20272 |
| 2024/0276674 A1* | 8/2024 | Nakamura | H01L 23/473 |
| 2024/0431071 A1* | 12/2024 | Lee | H05K 7/20927 |
| 2025/0008689 A1* | 1/2025 | Kwon | H05K 7/20272 |

FOREIGN PATENT DOCUMENTS

| | | | | |
|---|---|---|---|---|
| JP | 4085559 | | 5/2008 | |
| JP | 4100328 | | 6/2008 | |
| JP | 2011198822 A | * | 10/2011 | H01L 24/33 |
| JP | 2016-100353 | | 5/2016 | |
| KR | 10-2018-0025670 | | 3/2018 | |
| KR | 10-2020-0092926 | | 8/2020 | |
| KR | 10-2020-0124577 | | 11/2020 | |
| KR | 10-2264504 | | 6/2021 | |
| KR | 102505779 B1 | * | 3/2023 | H05K 7/20272 |
| KR | 10-2023-0094013 | | 6/2023 | |
| WO | WO2016/130773 | | 8/2016 | |

* cited by examiner

DOUBLE-SIDED COOLING APPARATUS FOR POWER MODULE

CROSS REFERENCE TO RELATED APPLICATION

The present application claims priority to Korean Patent Application No. 10-2021-0179797, filed Dec. 15, 2021, the entire contents of which is incorporated herein for all purposes by this reference.

BACKGROUND OF THE PRESENT DISCLOSURE

Field of the Present Disclosure

The present disclosure relates to a double-sided cooling apparatus for a power module, in which a cooling fluid is used for cooling both sides of the power module.

Description of Related Art

A power module is applied to an electric vehicle or the like, and controls high voltage and large current. Accordingly, the power module generates a very large amount of heat, and is thus required to be properly cooled to maintain performance and durability. To the present end, the power module is cooled by a cooling fluid, or waste heat of the power module is utilized in heating, etc. of the vehicle.

Conventionally, it is common that a cooling apparatus is connected to one side of the power module, and cooling fluid is circulated through the cooling apparatus, cooling the power module. However, a conventional cooling apparatus typically employs a simple tube or fin structure, and therefore its cooling efficiency is not high.

The cooling efficiency of the electric vehicle or the like is closely related to the overall energy efficiency of the vehicle, and largely affects the durability, performance, etc. of the power module. Accordingly, a new cooling structure is needed to improve the efficiency of cooling the power module.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a cooling apparatus for a power module, in which imbalanced cooling of a cooling module and lower durability of the power module due to the imbalanced cooling are improved.

According to an exemplary embodiment of the present disclosure, a double-sided cooling apparatus for a power module, including: a first cooling module provided to be in contact with a first side of the power module to which a switching device is mounted, and allowing cooling fluid to flow therein; and a second cooling module provided to be in contact with a second side of the power module provided opposite to the first side, and including a tube allowing the cooling fluid to flow in the tube, wherein the first cooling module includes a manifold cover including a plurality of cooling channels formed by a plurality of guide walls extending in a first direction, and a fin plate including a plurality of fins extending in a second direction intersecting the first direction, and the cooling channel includes a blocker formed in a predetermined portion of the cooling channel so that the cooling fluid in the first cooling module flows in a mixed form of lateral flow and vertical flow of the cooling fluid.

The cooling channel of the manifold cover may include a first channel and a second channel, the first channel may be blocked at a first end, the second channel may be blocked at a second end, and the fin plate may include a first side being in contact with the power module and a second side formed with the plurality of fins and be coupled to the manifold cover with the fins facing the guide walls so that the cooling fluid introduced into the first channel flows in the second direction and then flow out through the second channel.

The second cooling module may include a pressing cover to surround the tube, and the pressing cover uniformly presses the tube toward the second side of the power module.

The pressing cover may include a plurality of first openings spaced from each other, the manifold cover may include a plurality of second openings positioned corresponding to the first openings, and the first opening of the pressing cover and the second opening of the manifold cover may be coupled to each other to form pressing contact coupling between the first cooling module, the power module, and the second cooling module.

The first openings may be formed as equidistantly spaced apart along edge portions of the pressing cover, and the second openings may be formed at positions corresponding to the first openings, so that surface pressure is uniformly applied between the first cooling module, the power module, and the second cooling module.

The first channel of the manifold cover may be formed with a first blocker connecting first end portions of the opposite guide walls dividing the first channel so that the first channel may be blocked at an outlet side thereof, and the second channel of the manifold cover may be formed with a second blocker connecting second end portions of the opposite guide walls dividing the second channel so that the second channel may be blocked at an inlet side thereof.

An intersection angle between the first direction, in which the guide walls of the manifold cover are formed, and the second direction, in which the fins of the fin plate are formed, may range from 80 degrees to 100 degrees.

The first direction in which the guide walls of the manifold cover are formed may perpendicularly intersect the second direction in which the fins of the fin plate are formed.

The first cooling module may have higher stiffness than the second cooling module.

The second cooling module may be made of a material softer than the material of the first cooling module.

The tube may include a plurality of openings, and a partition wall provided between the adjacent openings and extending in the first direction to allow the cooling fluid to flow in the first direction.

A plurality of power modules may be provided being spaced apart between the first cooling module and the second cooling module so that the plurality of power modules share the first cooling module and the second cooling module, and the first cooling module may include a plurality of channel groups respectively corresponding to the power modules.

Each channel group may include the first channel and the second channel, the first channel being formed with a first blocker connecting the first end portions of the opposite guide walls dividing the first channel so that the first channel may be blocked at an outlet side thereof, and the second channel being formed with a second blocker connecting second end portions of the opposite guide walls dividing the second channel so that the second channel may be blocked at an inlet side thereof.

The first blocker in the first channel of a first side channel group may be connected to the second blocker of the second channel of an adjacent second side channel group, and the outlet side in the second channel of the first side-channel group may be connected to the inlet side in the first channel of the adjacent second side channel group.

The cooling apparatus for both sides of the power module according to an exemplary embodiment of the present disclosure secures high cooling performance by applying the jet impingement cooling effect to the first side generating a large amount of heat, in consideration of the characteristics of the power module which is asymmetric in the amount of generated heat between upper and lower sides thereof. Besides, the cooling apparatus for both sides of the power module according to an exemplary embodiment of the present disclosure prevents the cooling imbalance of the cooling module and the fracture of the power module by uniformly applying contact pressure between the power module and the cooler, in consideration of the characteristics of the cooling module where stress is concentrated on a portion coupling with the power module.

There are no limits to the technical effects as described above, and other technical effects may be expected from the following descriptions.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
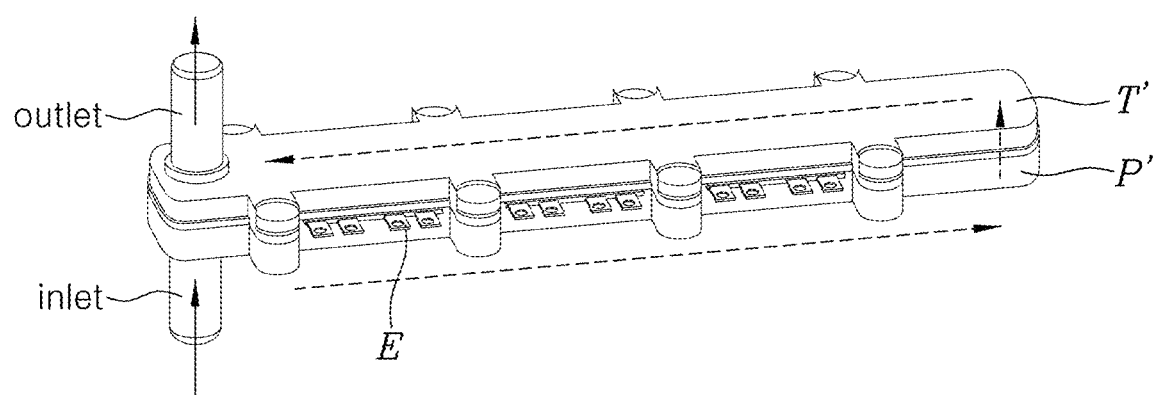
FIG. 1 is a perspective view of a double-sided cooling apparatus configured for a power module according to an exemplary embodiment of the present disclosure.

It may be understood that the appended drawings are not necessarily to scale, presenting a somewhat simplified representation of various features illustrative of the basic principles of the present disclosure. The specific design features of the present disclosure as disclosed herein, including, for example, specific dimensions, orientations, locations, and shapes will be determined in part by the particularly intended application and use environment.

In the figures, reference numbers refer to the same or equivalent portions of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Regarding embodiments of the present disclosure included in the exemplary embodiment or application, the specific structural or functional description is merely illustrative for describing the embodiments of the present disclosure, and embodiments of the present disclosure may be implemented in various forms but not be construed as being limited to the embodiments set forth in the exemplary embodiment or application.

In the exemplary embodiments of the present disclosure, the terms 'first,' 'second,' etc. are not intended to limit the present disclosure, but used to distinguish one element from another element. Unless otherwise clearly defined, singular forms include plural forms as well. Furthermore, the terms 'include,' 'have,' etc. specify the presence of stated features or elements, but do not preclude the addition of one or more other features or elements. In the accompanying drawings, the size, thickness, etc. of the elements may be exaggerated or reduced for convenience of description. Furthermore, the expression 'direction' includes bidirectionality of an extending line unless otherwise explicitly defined as having unidirectionality.

Below, embodiments of the present disclosure will be described in detail with reference to the accompanying drawings.

Figure 2:
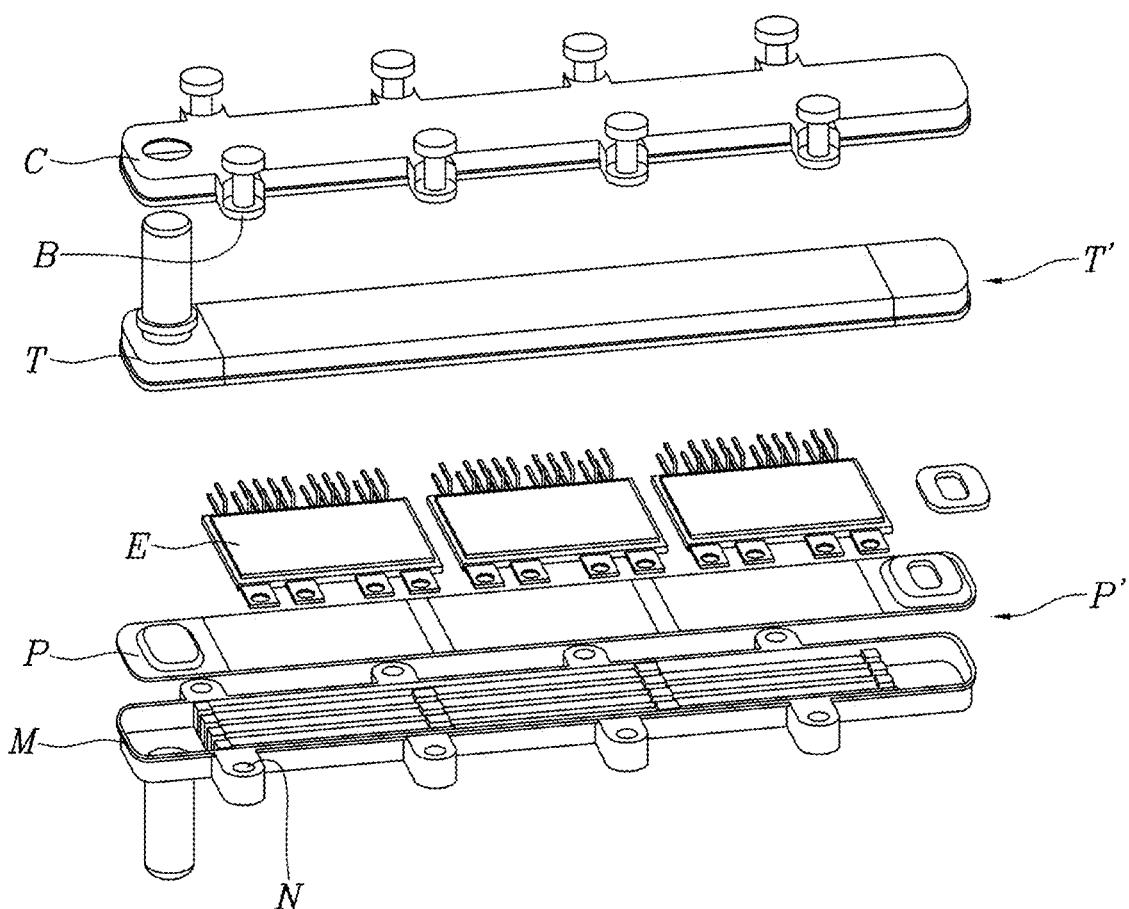
FIG. 2 is an exploded perspective view of the cooling apparatus configured for both sides of the power module shown in FIG. 1.
Figure 10:
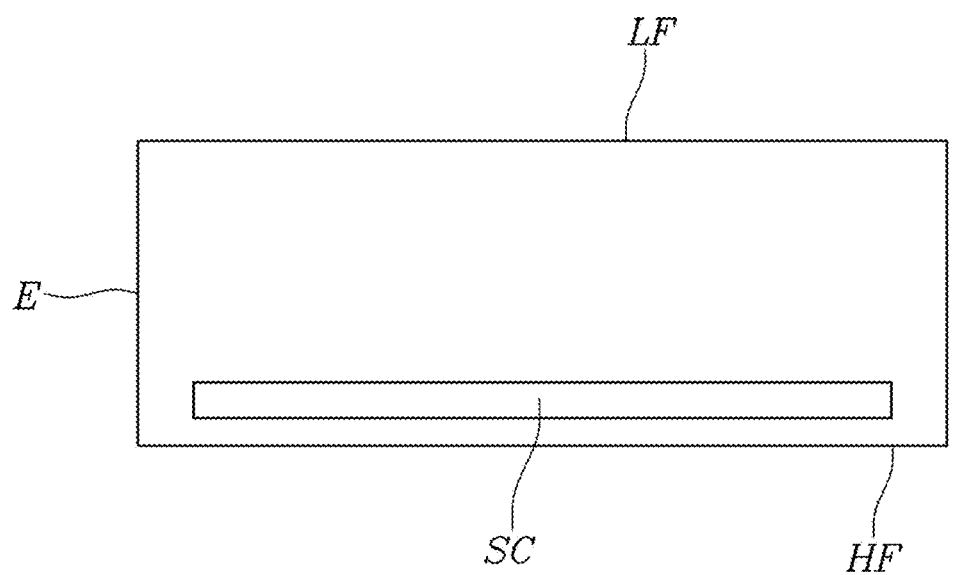
FIG. 10 show an assembly method of the cooling apparatus configured for both sides of the power module shown in FIG. 1.

FIG. 1 and FIG. 10 are is a perspective views of a double-sided cooling apparatus for a power module according to an exemplary embodiment of the present disclosure, and FIG. 2 is an exploded perspective view of the cooling apparatus for both sides of the power module shown in FIG. 1. As shown therein, the cooling apparatus for both sides of the power module according to an exemplary embodiment of the present disclosure includes a power module E having a first side HF on which a switching device SC is provided, and a second side LF provided opposite to the first side HF; a first cooling module P' being in contact with the first side HF of the power module E to cool the power module E; and a second cooling module T' being in contact with the second side LF of the power module E to cool the power module E, and including a tube T in which a cooling fluid flows.

Figure 3:
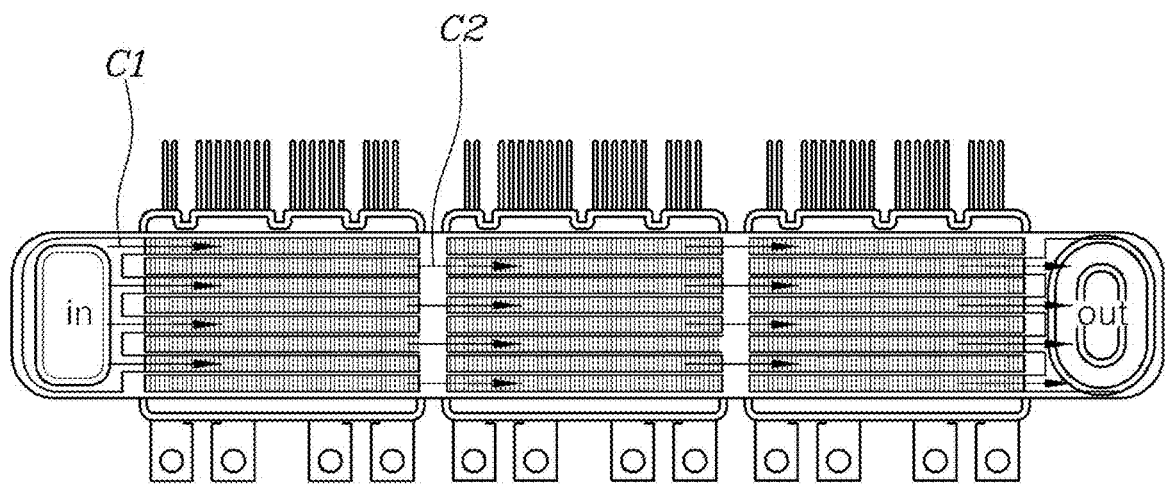
FIG. 3 and FIG. 4 show mechanisms of a first cooling module in the cooling apparatus configured for both sides of the power module shown in FIG. 1.
Figure 4:
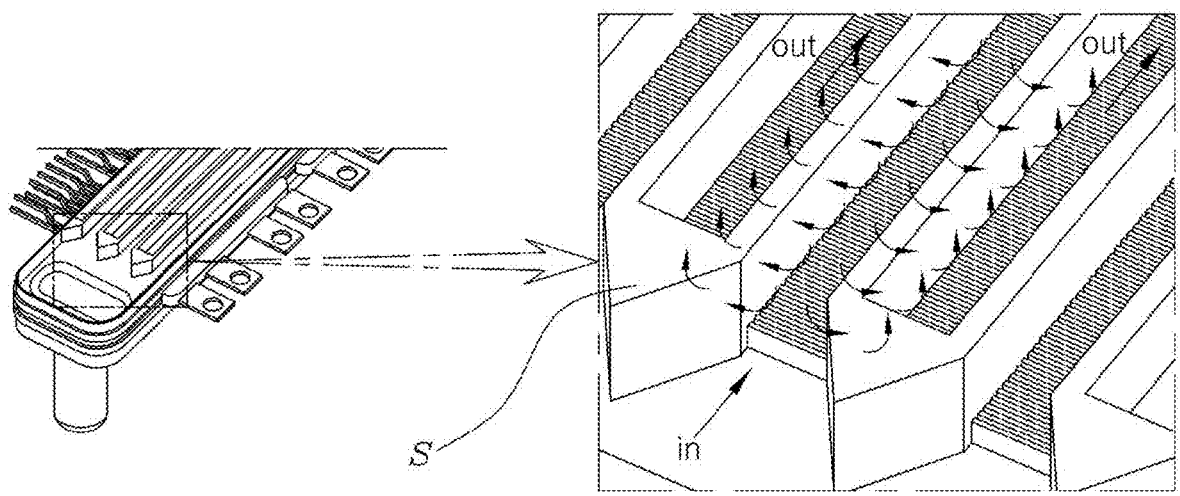

Meanwhile, as shown in FIGS. 2, 3 and 4, the first cooling module P' may include a plurality of guide walls S extending in a first direction and forming a plurality of cooling channels so that the cooling fluid can flow from an inlet to an outlet in the first direction; a manifold cover M including first channels C1, which are blocked at an outlet side thereof, and second channels C2, which are blocked at an inlet side thereof, among the plurality of cooling channels; and a fin plate P including a first side being in contact with the power module E, and a second side formed with a plurality of fins PP thereon extending in a second direction so that the cooling fluid introduced into the first channels C1 via the inlet can flow in the second direction intersecting the first direction and then flow to the outlet through the second channels C2. Here, the second cooling module T' will be called a tube cooler including a tube.

Furthermore, as shown in FIG. 1 and FIG. 2, the fin plate P has a first side being in contact with the power module E and a second side formed with the plurality of fins PP. The manifold cover M includes the first channels C1 blocked at the outlet side, and the second channels C2 blocked at the inlet side. The power module E is cooled as the first cooling module P' including the manifold cover M and the fin plate P is being in contact with the first side of the power module E.

Furthermore, as shown in FIG. 1 and FIG. 2, the second cooling module T' further includes a pressing cover C surrounding the tube T, and the pressing cover C may include a protruding surface protruding toward a side of the tube T so that pressure may be uniformly applied to the side of the tube provided opposite a side where the tube T is in contact with the second side LF of the power module E. That is, in the cooling apparatus for both sides of the power module according to an exemplary embodiment of the present disclosure, the protruding surface in the pressing cover C protrudes toward the side of the tube T so that uniform stress may be applied throughout the side of the power module E. Furthermore, the pressing cover C may include the protruding surface protruding toward the side of the tube T so that uniform pressure may be applied to the side of the tube T provided opposite to the side where the tube T is in contact with the second side LF of the power module E.

Furthermore, as shown in FIG. 2, the pressing cover C further includes a first opening B in which a head or chamfer of a screw may be inserted, and the manifold cover M may further include a second opening N in which a shank of the screw may be inserted. Furthermore, a bolted joint may be formed between the second opening N of the manifold cover M and the first opening B of the pressing cover C. Alternatively, a screw may be joined to abase material formed with a threaded second opening, as not the bolted joint but a screw joint. Alternatively, both the first opening B and the second opening N may be threaded and joined by a screw, as not the bolted joint but a stud joint. With the present structure, joining force may be tuned according to portions so that surface pressure may be uniformly applied to a plurality of power modules.

In other words, the pressing cover C includes the plurality of first openings B spaced from each other, and the manifold cover M includes the plurality of second openings N positioned corresponding to the first openings B. As the first opening B of the pressing cover C and the second opening N of the manifold cover M are joined to each other, pressure contact coupling may be formed between the first cooling module P', the power module E, and the second cooling module T'. Furthermore, the first openings B are equidistantly spaced apart along edge portions of the pressing cover C, and the second openings N are formed at the positions corresponding to the first openings B, uniformizing the surface pressure applied between the first cooling module P', the power module E, and the second cooling module T'.

Furthermore, as shown in FIG. 2, the first cooling module P', which is being in contact with the first side HF of the power module E provided with the switching device SC, includes the manifold cover M and the fin plate P, and the second cooling module T', which is being in contact with the second side LF of the power module E includes as a tube cooler T and the pressing cover C.

In FIG. 10, the switching device SC is a heating element, and the first side HF is more affected by heat transfer caused by heat flux than the second side LF. Therefore, when the first side HF and the second side LF are equally in contact with the cooling module, imbalanced cooling may occur. Accordingly, both sides are different in thermal expansion, and it is thus impossible to avoid fatigue accumulated due to thermal stress. Here, the switching device is to turn on or off power for operating a motor, and may include at least one among BJT, silicon controlled rectifier (SCR), TRIAC, unijunction transistor (UJT), programmable unijunction transistor (PUT), junction field effect transistor (JFET), gate turn off thyristor (GTO), MOS controlled thyristor (MCT), injection-enhanced gate transistor (IEGT), integrated gate bipolar transistor (IGBT), integrated gate commutated thyristor (IGCT), metal oxide semiconductor field effector transistor (MOSFET), intelligent power device (IPD: semiconductor switch), and a diode.

The cooling apparatus for both sides of the power module according to an exemplary embodiment of the present disclosure resolves an imbalance in cooling between the first side HF and the second side LF so that a cooling method of having a local and high heat transfer effect by directly jetting the cooling fluid to a hot wall surface to remove heat like jet impingement cooling is used for the first side HF, but the present cooling method is not used for the second side LF to which less heat is transferred. As the cooling imbalance is resolved, the overall deformation of the cooling apparatus and the power module is prevented, having a significant effect on the durability and performance of the power module.

FIG. 3 and FIG. 4 show mechanisms of a first cooling module in the cooling apparatus for both sides of the power module shown in FIG. 1. As shown therein, in the cooling apparatus for both sides of the power module according to an exemplary embodiment of the present disclosure, a fluid of the first cooling module P' is guided to flow from the inlet to the outlet in the first direction by the guide walls S extending from the first channel C1 of the manifold cover M in the first direction thereof. Furthermore, the cooling fluid, whose flowing is blocked by the first blocker B1 at the outlet side of the first channel C1, is guided to flow to the second channels C2 adjacent to the first channel C1 after flowing through fins PP of a fin plate P in the second direction intersecting the first direction. In the present process, lateral flow and vertical flow are mixed to generate turbulence. Accordingly, the cooling fluid is guided to flow again in the first direction by the second channels C2 blocked by the second blocker B2 at the inlet side and the guide walls S extending in the first direction, having a jet impingement cooling effect.

Meanwhile, the second direction in which the fins PP of the fin plate P are extended may be perpendicular to the first direction in which the guide walls S are extended. In other words, the first channels C1 included in the manifold cover M cause the cooling fluid to flow through the perpendicular fins PP while flowing along the direction in which the guide walls S are extended, having the jet impingement cooling effect.

The guide walls S are used to guide the cooling fluid to flow toward the inlet and the outlet in the first direction. Next, the first channel C1, in which the cooling fluid flows in the first direction, is blocked by the first blocker B1 at the outlet side of the first channel C1. The blocked and overflowing cooling fluid flows along the plurality of fins PP extending in the second direction intersecting the first direction and flows to the second channels C2 via the upper or lower portion of the guide walls S. Accordingly, the cooling apparatus for both sides of the power module according to an exemplary embodiment of the present disclosure generates turbulence, i.e., a velocity component perpendicular to the flowing direction while the cooling fluid flows in the second channel. On the other hand, the second channels C2 are blocked by the second blocker B2 at the inlet side, so that the cooling fluid flowing in the second channels C2 can flow toward the outlet side. Meanwhile, FIG. 4 shows that the first blocker B1 and the second blocker B2, respectively have protruding shapes but are not limited thereto.

According to an exemplary embodiment of the present disclosure, the cooling fluid is used to cool the power module. To cool the power module, the first cooling module P' according to an exemplary embodiment of the present disclosure has jet impingement cooling effect. Here, the jet impingement cooling refers to the cooling method of directly jetting the cooling fluid to a hot wall surface to remove heat, having a local and high heat transfer effect. To increase such a jet cooling effect, it is necessary to use turbulent flow rather than laminar flow. Here, the turbulence means flow having a velocity component perpendicular to a flowing direction, i.e., irregular and diffusible flow having 3D vorticity in not the flowing direction but up, down, left and right directions. When turbulence is generated around an object, a cooling area is enlarged and cooling fluid mixing increases, increasing cooling efficiency.

In the cooling apparatus for both sides of the power module according to an exemplary embodiment of the present disclosure, the second direction, in which the fins PP of the fin plate P are extended, intersects the first direction, in which the guide walls of the manifold cover M are extended, to generate turbulent flow to further enhance the jet impingement cooling effect. This intersection causes turbulence to be generated more than a simple fin plate, where a fluid flows as laminar flow, such as a dimple pattern on a golf ball or a bumpy skin of a shark. Therefore, according to an exemplary embodiment of the present disclosure, the cooling apparatus for the power module is improved in cooling performance. P', the first cooling module that implements the jet impingement cooling is coupled to the first side of the power module generating a large amount of heat, and T', the second cooling module of a general tube type causing the laminar flow is coupled to the second side generating a small amount of heat, resolving thermal imbalance between the opposite sides of the power module.

Figure 5:
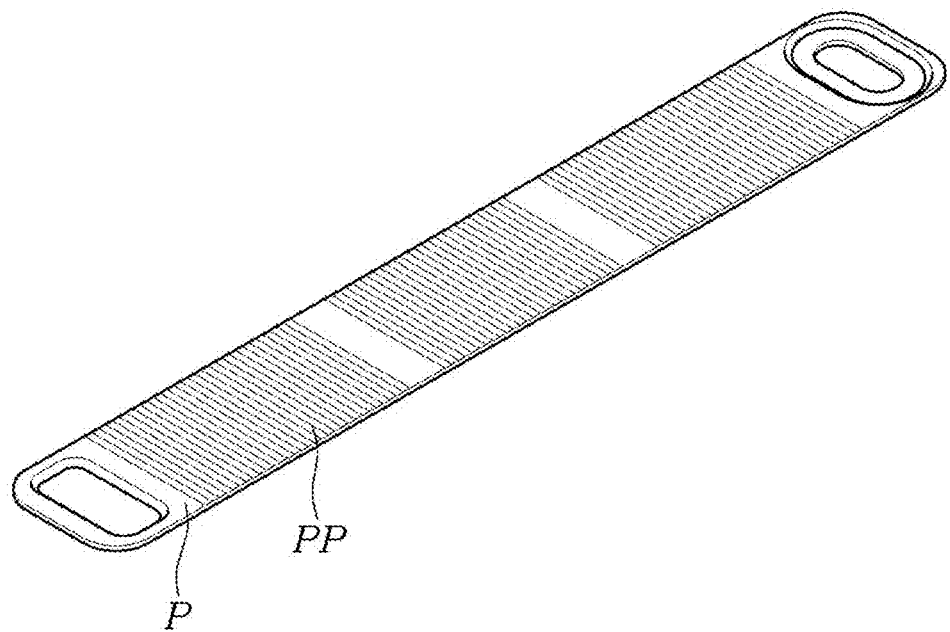
FIG. 5 and FIG. 6 show a fin plate and a manifold cover of a first cooling module in the cooling apparatus configured for both sides of the power module shown in FIG. 1.
Figure 6:
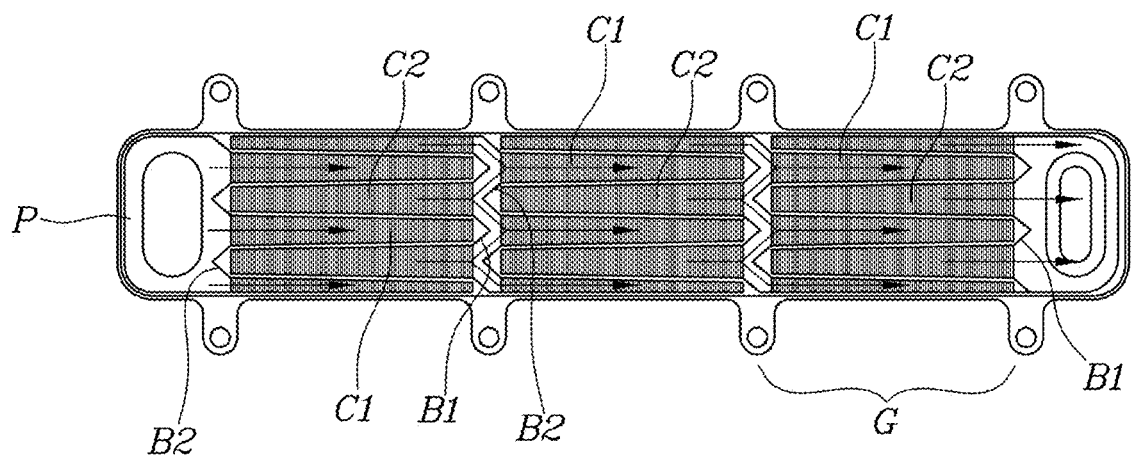

FIG. 5 and FIG. 6 show a fin plate and a manifold cover of a first cooling module in the cooling apparatus for both sides of the power module shown in FIG. 1.

The fins PP of the fin plate P shown in FIG. 5 may include grooves recessed in a third direction as alternately engraved being spaced from each other. Alternatively, unlike the fin plate P shown in FIG. 5, the fins PP of the fin plate may include pins extending in the second direction as alternately embossed being spaced from each other. In other words, the fin may have a pin fin shape like a pin.

In the cooling apparatus for both sides of the power module according to an exemplary embodiment of the present disclosure, an intersection angle between the second angle in which the fin of the first cooling module is extended and the first direction may range from 80 degrees to 100 degrees. In other words, an angle between the extending direction of the fins PP and the flowing direction of the cooling fluid in the manifold cover is not necessary 90 degrees. Alternatively, the fins PP may be slightly inclined.

Furthermore, the second direction in which the fins of the first cooling module are extended may be perpendicular to the direction in which the guide walls are extended. Furthermore, a first cross-section of the fin in a direction perpendicular to the protruding direction of the fin may be partially or entirely decreased in size in the protruding direction. Furthermore, a second cross-section of the fin in a direction parallel with the protruding direction of the fin may be partially or entirely shaped as one of a right-angled triangle, an isosceles triangle, and a semicircle. Furthermore, the fins may be alternately formed as spaced apart leaving a predetermined distance, or may be repetitively formed without leaving a predetermined distance. Like this, the shape of the fins, the array of the fins, and the structure of the fin plate P for coupling the fins and the plate are not limited as long as they can match the manifold cover M.

FIG. 6 shows the manifold cover of the first cooling module in the cooling apparatus for both sides of the power module according to an exemplary embodiment of the present disclosure. As shown in FIG. 6, the cooling fluid in the first channel C1 and the second channels C2 of the manifold cover may be collected at a point after entirely passing the first side HF of the heating module, i.e., a place adjacent to the outlet side thereof. Then, the cooling fluid is guided to flow in the first direction by the first channel C1 blocked at the outlet side and the guide walls extending in the first direction, and repeats the foregoing process, cooling the heating module being in contact with the side on which the cooling fluid flows.

Between the first cooling module and the second cooling module, the plurality of power modules are provided as spaced from each other, so that the plurality of power modules can share the first cooling module and the second cooling module. The first cooling module may be formed with a plurality of channel groups G, respectively corresponding to the power modules.

Each channel group G includes the first channel C1 and the second channels C2. The first channel C1 is formed with the first blocker B1 connecting first end (outlet side) portions of the guide walls facing each other, by which the first channel C1 is divided, to block the outlet side. The second channel C2 is formed with the second blocker B2 connecting second end (inlet side) portions of the guide walls facing each other, by which the second channel C2 is divided, to block the inlet side.

Furthermore, the plurality of channel groups are connected in series so that the second channel C2 of the first side channel group is connected to the inlet side of the first channel C1 of the second side channel group adjacent to the outlet side, implementing the jet impingement cooling effect in succession.

Figure 7:
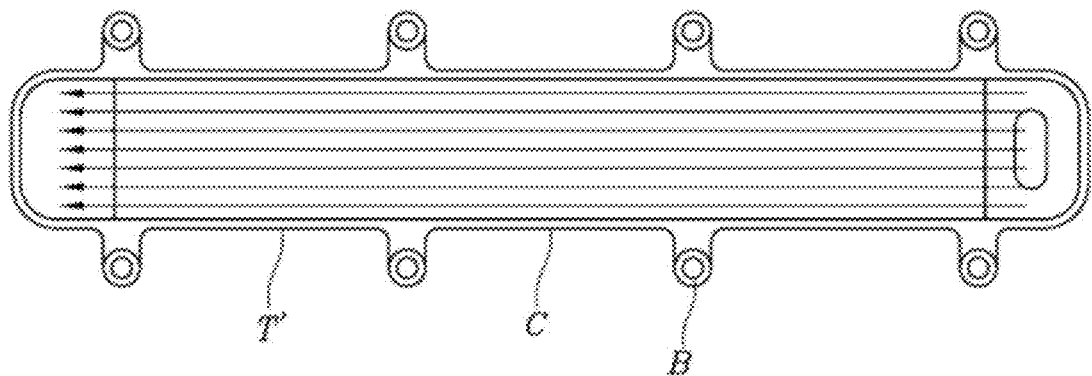
FIG. 7 and FIG. 8 show a second cooling module in the cooling apparatus configured for both sides of the power module shown in FIG. 1.
Figure 8:
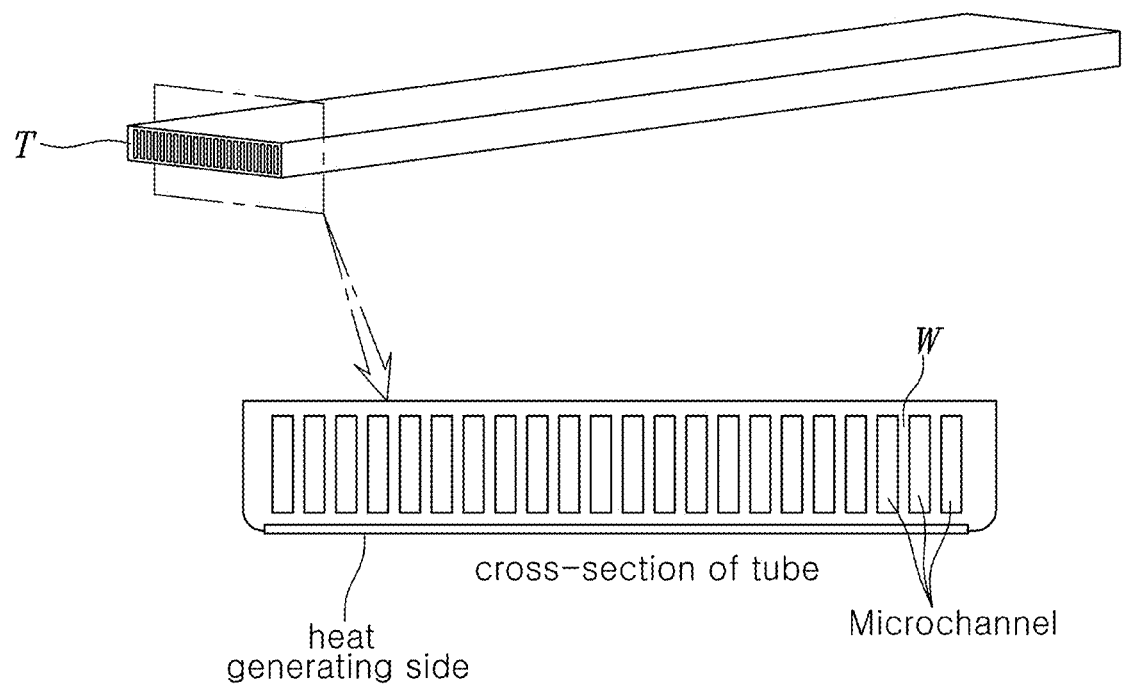

FIG. 7 shows the second cooling module in the cooling apparatus for both sides of the power module according to an exemplary embodiment of the present disclosure. In the cooling apparatus for both sides of the power module according to an exemplary embodiment of the present disclosure, the tube cooler T' forms a plurality of microchannels from cooling the second side LF adjacent to the power module. Meanwhile, the tube of the tube cooler T' is straight to perform cooling based on not turbulence but laminar flow, and may be made of aluminum. FIG. 8 shows a cross-section of the tube in the cooling apparatus for both sides of the power module according to an exemplary embodiment of the present disclosure. The tube of the tube cooler T' may include a plurality of openings, through which the cooling fluid flowing from the inlet to the outlet is distributed into each cooling channel, and a partition wall W provided between the opening and the adjacent opening and extending in the first direction so that the cooling fluid can flow from the inlet to the outlet in the first direction. That is, the cooling apparatus for both sides of the power module according to an exemplary embodiment of the present disclosure forms the microchannels formed by the partition wall W of the tube cooler T' to divide the cooling fluid. The microchannels make the cooling fluid have the laminar flow on the surface being in contact with the second side.

As shown in FIG. 8, the tube cooler T' is in close contact with the second side LF of the power module. The tube cooler T' having the cooling effect based on the laminar flow passing the cross-section of the tube has lower cooling performance than the first cooling module having the jet impingement cooling effect based on the turbulence, but has relatively low loss in pressure and uniform cooling performance. Furthermore, the cooling fluid flowing in the first cooling module partially flows in the tube cooler T' while absorbing heat, and therefore the cooling fluid flows through the tub cooler T' having relatively low cooling performance, uniformly cooling the first and second sides of the power module.

Figure 9:
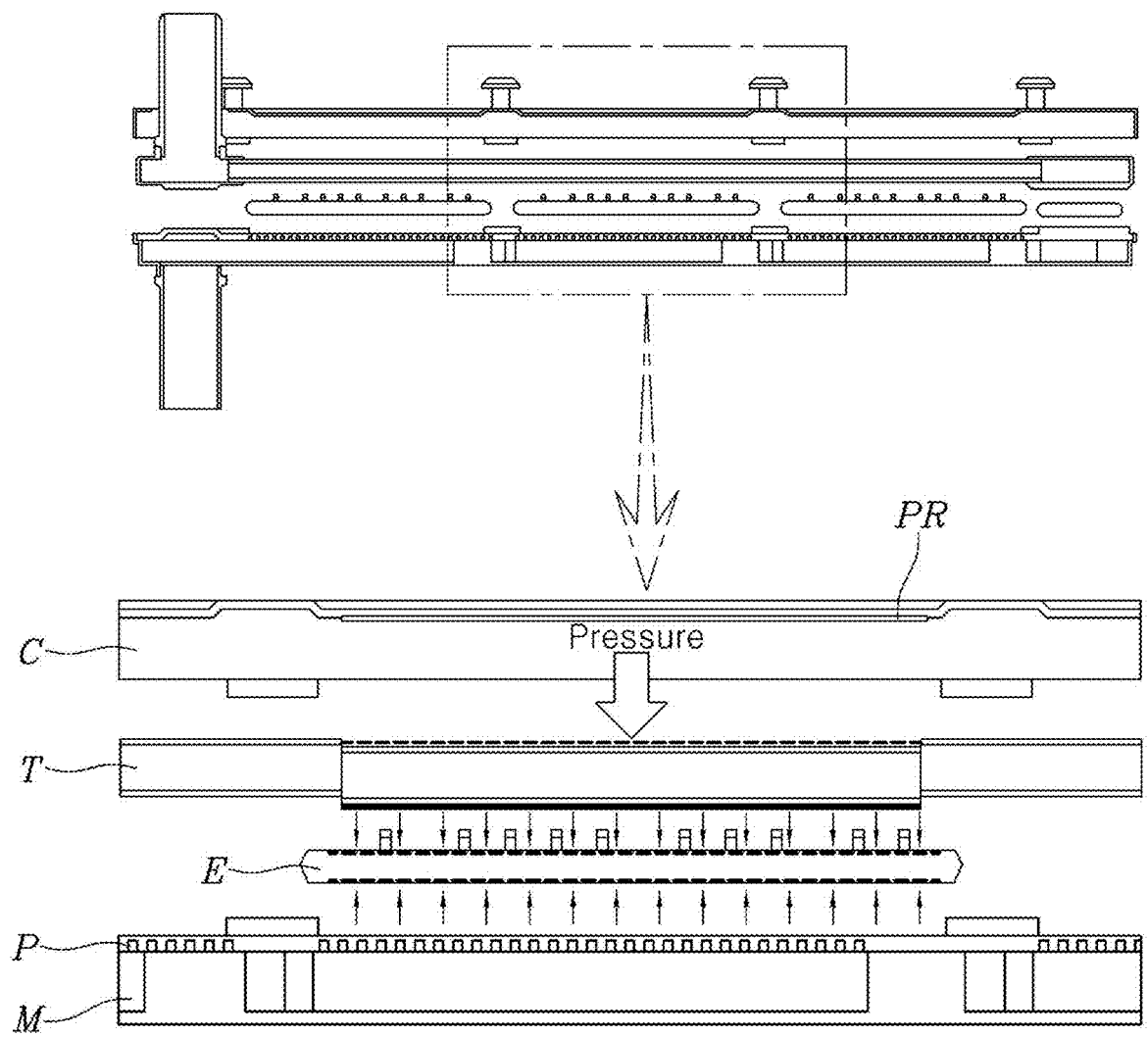
FIG. 9 shows the power module in the cooling apparatus configured for both sides of the power module shown in FIG. 1.

FIG. 9 shows a pressing mechanism in which a protruding surface of the pressing cover presses the tube cooler to uniformly distribute contact pressure between the power module and the cooler when the cooling apparatus for both sides of the power module according to an exemplary embodiment of the present disclosure are assembled. The pressing cover C may include the protruding surface protruding toward a side of the tube T so that pressure may be uniformly applied to the side of the tube provided opposite a side where the tube T is in contact with the second side LF of the power module.

As shown in FIG. 9, the manifold cover M and the fin plate P coupled in the first cooling module are in contact with the first side of the power module, and the tube cooler T' of the second cooling module is in contact with the second side of the power module, implementing a cooling function. In the instant case, each cooling module may be bolted to the power module. Stress may be concentrated on the bolted joint or the like joint. The cooling imbalance may occur between a portion on which the stress is concentrated and the other portion. To resolve such an imbalance in stress, the pressing cover C is coupled to the tube in the cooling apparatus for both sides of the power module according to an exemplary embodiment of the present disclosure. The protruding surface PR of the pressing cover protruding facing the second side of the power module applies pressure when coupled to the power module and the first cooling module. Accordingly, the pressure is applied even a portion other than the joint, so that the stress may be uniformly distributed between the first side and the second side. Consequently, the second cooling module coupling with a slightly deformed protruding surface resolves an imbalance in stress, and thus resolves an imbalance in cooling.

To the present end, the tube of the tube cooler T' may have lower stiffness than the fin plate. Furthermore, the tube of the tube cooler T' may be made of metal, plastic, or a combination of metal and plastic, or may be made of aluminum. In other words, the tube T of the tube cooler T' may be made of a soft material. With this, a portion generating a small amount of heat is more thermally deformed to be balanced with the physical deformation of a portion generating a large amount of heat, resolving an imbalance in surface pressure applied to the power module.

Furthermore, as shown in FIG. 9, a portion where the protruding surface PR is formed has a stepped portion. With this, the cooling fluid flowing as the laminar flow in the tube of the tube cooler T' may be mixed with the fluid which is not in contact with the second side yet. Accordingly, the tube cooler T' is improved in cooling performance.

Furthermore, the fin plate P included in the second cooling module shown in FIG. 9 is required to have a predetermined height or more, increasing volume and weight. However, only the first side is in contact with the fin plate P, and the second side is in contact with the tube cooler T', so that the second side may be designed to be structurally simpler than the first cooling module and thus have less volume and less weight. With this, the cooling apparatus for both sides of the power module according to an exemplary embodiment of the present disclosure is further advantageous in terms of a package.

The cooling apparatus for both sides of the power module according to an exemplary embodiment of the present disclosure secures high cooling performance by applying the jet impingement cooling effect to the first side generating a large amount of heat, in consideration of the characteristics of the power module which is asymmetric in the amount of generated heat between upper and lower sides thereof. Besides, the cooling apparatus for both sides of the power module according to an exemplary embodiment of the present disclosure prevents the cooling imbalance of the cooling module and the fracture of the power module by uniformly applying contact pressure between the power module and the cooler, in consideration of the characteristics of the cooling module where stress is concentrated on a portion coupling with the power module.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of predetermined exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A double-sided cooling apparatus for a power module, the double-sided cooling apparatus comprising:
   a first cooling module including an inlet through which cooling fluid flows in, the first cooling module provided to be in contact with a first side of the power module to which a switching device of the power module is mounted, and allowing the cooling fluid to flow in the first cooling module;

wherein the first cooling module includes:
a manifold cover including a plurality of cooling channels formed by a plurality of guide walls extending in a first direction; and
a fin plate including a plurality of fins extending in a second direction intersecting the first direction, and
wherein the cooling channels include:
at least one blocker formed in a predetermined portion of the cooling channels so that the cooling fluid in the first cooling module flows in a mixed form of a lateral flow in the first direction and a vertical flow in the second direction of the cooling fluid within the manifold cover, and
a second cooling module including an outlet through which the cooling fluid flows out, the second cooling module provided to be in contact with a second side of the power module, the second side of the power module opposite to the first side of the power module and away from the switching device mounted on the first side of the power module, the second cooling module including a tube allowing the cooling fluid to flow within the tube in an unmixed form of a lateral flow in a direction opposite to the first direction,
wherein the first cooling module and the second cooling module are coupled in a vertical direction to form a single flow path from the inlet to the outlet that sequentially passes through the first cooling module and the second cooling module.

2. The cooling apparatus of The cooling apparatus of claim 1,
wherein the cooling channels of the manifold cover include at least one first channel and at least one second channel, and the at least one blocker includes at least one first blocker and at least one second blocker,
wherein the at least one first channel is blocked at a downstream end portion of the first channel by the at least one first blocker, and the at least one second channel is blocked at an upstream end portion of the at least one second channel by the at least one second blocker, and
wherein the fin plate includes a first fin side being in contact with the power module and an opposite second fin side formed with the plurality of fins, the second fin side is coupled to the manifold cover with the fins facing the guide walls so that the cooling fluid flows into and through the at least one first channel in the first direction, flows in at least in part in the second direction around at least one of the guide walls, the at least one first blocker or the at least one second blocker, and then flows through and out of the at least one second channel in the first direction.

3. The cooling apparatus of claim 2,
wherein the at least one first channel of the manifold cover is formed with the at least one first blocker connecting downstream end portions of the guide walls separating the at least one first channel from the at least one second channel so that the at least one first channel is blocked at an outlet side of the at least one first channel, and
wherein the at least one second channel of the manifold cover is formed with the at least one second blocker connecting upstream end portions of the guide walls separating the at least one second channel from the at least one first channel so that the at least one second channel is blocked at an inlet side of the at least one second channel.

4. The cooling apparatus of claim 3,
wherein the power module include a plurality of power modules, the plurality of power modules are provided being spaced apart between the first cooling module and the second cooling module so that the plurality of power modules share the first cooling module and the second cooling module, and
wherein the plurality of cooling channels include a plurality of cooling channel groups, each of the plurality of cooling channel groups having the at least one first blocker and the at least one second blocker, the first cooling module includes the plurality of channel groups respectively corresponding to each of the power modules.

5. The cooling apparatus of claim 4, wherein each of the cooling channel groups includes the at least one first channel and the at least one second channel, the at least one first channel being formed with the at least one first blocker connecting the downstream end portions of the guide walls separating the at least one first channel from the at least one second channel so that the at least one first channel is blocked at the outlet side of the at least one first channel, and the at least one second channel being formed with the at least one second blocker connecting the upstream end portions of the guide walls separating the at least one second channel from the at least one first channel so that the at least one second channel is blocked at the inlet side of the at least one second channel.

6. The cooling apparatus of claim 5,
wherein the plurality of cooling channel groups include a first cooling channel group and a second cooling channel group adjacent to the first cooling channel group, and
wherein the at least one first blocker in the at least one first channel of the first cooling channel group is proximate to the at least one second blocker of the second at least one channel of the second cooling channel group, and an outlet side of the at least one second channel of the first cooling channel group is connected to an inlet side of the at least one first channel of the second cooling channel group.

7. The cooling apparatus of claim 1, wherein the second cooling module includes a pressing cover to surround the tube, and the pressing cover uniformly presses the tube toward the second side of the power module.

8. The cooling apparatus of claim 7,
wherein the pressing cover includes a plurality of first openings spaced from each other along a longitudinal direction of the pressing cover,
wherein the manifold cover includes a plurality of second openings positioned corresponding to the first openings, and
wherein the first openings of the pressing cover and the second openings of the manifold cover are coupled to each other to form pressing contact coupling between the first cooling module, the power module, and the second cooling module.

9. The cooling apparatus of claim 8, wherein the first openings are formed as equidistantly spaced apart along edge portions of the pressing cover, and the second openings are formed at positions corresponding to the first openings, so that surface pressure is uniformly applied between the first cooling module, the power module, and the second cooling module.

10. The cooling apparatus of claim 1, wherein an intersection angle between the first direction, in which the guide walls of the manifold cover are formed, and the second direction, in which the fins of the fin plate are formed, ranges from 80 degrees to 100 degrees.

11. The cooling apparatus of claim 1, wherein the first direction in which the guide walls of the manifold cover are formed perpendicularly intersects the second direction in which the fins of the fin plate are formed.

12. The cooling apparatus of claim 1, wherein the first cooling module has higher stiffness than the second cooling module.

13. The cooling apparatus of claim 1, wherein the second cooling module is made of a material softer than a material of the first cooling module.

14. The cooling apparatus of claim 1, wherein the tube includes a plurality of openings, and a partition wall provided between the adjacent ones of the openings and extending in the first direction to allow the cooling fluid to flow through the openings in the direction opposite of the first direction.

15. The cooling apparatus of claim 1,
wherein the power module include a plurality of power modules, the plurality of power modules are provided being spaced apart between the first cooling module and the second cooling module so that the plurality of power modules share the first cooling module and the second cooling module, and
wherein the plurality of cooling channels include a plurality of cooling channel groups, each of the plurality of cooling channel groups having the at least one blocker, the first cooling module includes the plurality of channel groups respectively corresponding to each of the power modules.

* * * * *